(12) United States Patent
Huijser

(10) Patent No.: US 6,563,380 B2
(45) Date of Patent: May 13, 2003

(54) DUAL BRIDGE AMPLIFIER

(76) Inventor: Jan Paulus Freek Huijser, Gerstweg 2, 6534 AE Nijmegen (NL)

( * ) Notice: Subject to any disclaimer, the term of this patent is extended or adjusted under 35 U.S.C. 154(b) by 0 days.

(21) Appl. No.: 09/888,146

(22) Filed: Jun. 22, 2001

(65) Prior Publication Data

US 2002/0097086 A1 Jul. 25, 2002

(30) Foreign Application Priority Data

Jun. 23, 2000 (EP) .............................. 00202197

(51) Int. Cl.$^7$ ............................. H03F 3/45; H03F 3/68; H03F 21/00
(52) U.S. Cl. ...................... 330/69; 330/124 R; 381/121
(58) Field of Search ................ 330/69, 124 R; 381/121

(56) References Cited

U.S. PATENT DOCUMENTS

| 4,758,796 A | * | 7/1988 | Verhoeven et al. | ......... 330/146 |
| 5,444,417 A | * | 8/1995 | Botti et al. | ............ 330/124 R |
| 6,107,886 A | * | 8/2000 | Kusakabe et al. | .......... 330/146 |

FOREIGN PATENT DOCUMENTS

| EP | 0492291 A1 | 7/1992 | |
| EP | 0613242 A1 | 2/1993 | ............. H03F/3/68 |
| GB | 2132858 | 12/1983 | ............. H04S/1/00 |

* cited by examiner

Primary Examiner—Patricia T. Nguyen
(74) Attorney, Agent, or Firm—Aaron Waxler

(57) ABSTRACT

In a dual bridge amplifier (1) for processing two input signals ($I_{in1}$; $I_{in2}$) and providing two amplified output signals ($V_{L1}$; $V_{L2}$) into two separate loads, comprising two signal amplifiers (10; 20) and one common buffer amplifier (30), the channel separation is improved by utilizing a feedback coupling over the load.

9 Claims, 2 Drawing Sheets

DUAL BRIDGE AMPLIFIER

Figure 1:
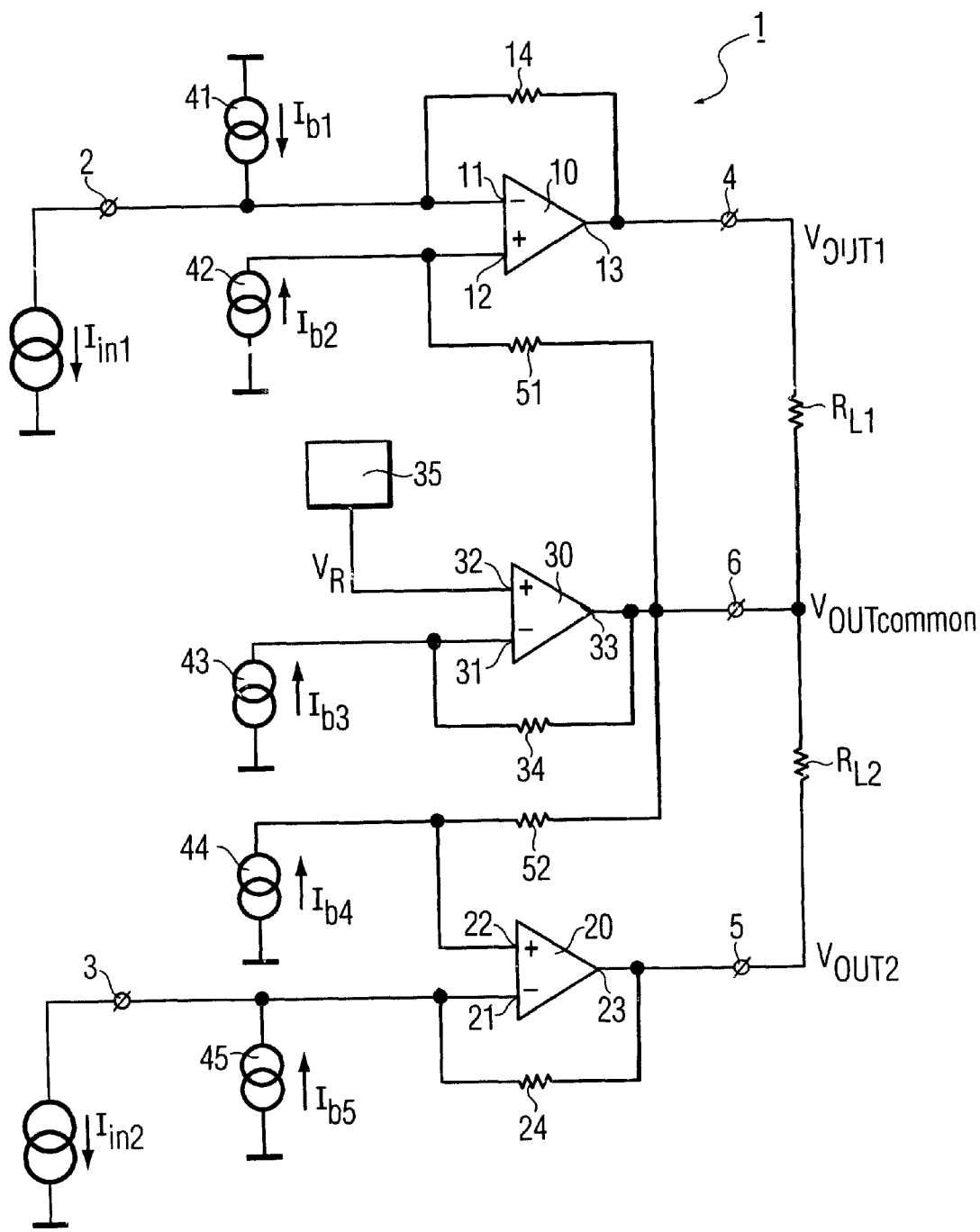

The present invention relates in general to a dual bridge amplifier for processing two input signals and providing two amplified output signals into two separate loads, comprising two signal amplifiers and one common buffer amplifier. Such an amplifier is known per se, for instance from European patent application 0.492.291.

The present invention relates particularly to an amplifier for amplifying signals in the audible frequency range, for driving a loudspeaker. Therefore, the present invention will hereafter be further explained for this field of the art. However, it is noted that the present invention is not limited to such application.

For driving a load such as a loudspeaker, an amplifier stage can be configured in several ways. In a single-ended configuration, one terminal of the loudspeaker is coupled to an output terminal of the amplifier through a capacitor for eliminating any DC signal components, while the other terminal of the loudspeaker is connected to mass. In case two loudspeakers are to be driven, for instance in case of a stereo signal, or in a car audio system comprising loudspeakers in the front and in the back, two amplifiers are necessary, each amplifier having an output terminal coupled to a first terminal of a respective loudspeaker through a respective capacitor, while the second terminals of said loudspeakers are connected to mass. In such a configuration, three output terminals are necessary for connecting two loudspeakers, one of said output terminals being a mass output terminal.

In another configuration, an amplifier stage for driving one loudspeaker comprises two amplifiers, each of said amplifiers having an output terminal connected to a respective terminal of the loudspeaker. Such configuration offers many advantages over the single ended configuration. No mass terminal is necessary, and also no capacitors are necessary for eliminating a DC signal component. Further, the loudspeaker can be driven with a relatively large power whereas each of said amplifiers is loaded only in a relatively limited extent. An amplifier stage according to such configuration will be indicated as a bridge amplifier.

For driving two loudspeakers with a bridge amplifier, each of said loudspeakers being connected in the above-described way, a total of four amplifiers would be necessary. However, it is possible to use one amplifier in common for both loudspeakers: an output terminal of a first amplifier is connected to a first terminal of one loudspeaker, an output terminal of a second amplifier is connected to a first terminal of the second loudspeaker, and an output terminal of the third amplifier is connected to the second terminal of the first loudspeaker as well as to the second terminal of the second loudspeaker. This third, common amplifier is also indicated as buffer amplifier. A general advantage of such configuration is the fact that only three output terminals are necessary for driving two loudspeakers in a bridge amplifier configuration.

An example of such dual bridge amplifier configuration is described in EP-A-0.492.291. A general objective of the present invention is to provide a dual bridge amplifier stage with improved properties with respect to the dual bridge amplifier stage as described in said publication.

A basic problem of such a configuration is the fact that the buffer amplifier has a certain non-zero output impedance. This results in a bad channel separation, as can be understood as follows. In a situation where a first one of the input signals is zero and the other input signal is non-zero, the output of the corresponding first amplifier should be zero and the output of the corresponding second amplifier should reflect the non-zero second input signal. This output of the second amplifier causes a current through the corresponding second loudspeaker, and this current causes a voltage signal at the output terminal of the buffer amplifier due to the non-zero output impedance of this buffer amplifier. As a consequence, a signal current is generated in the first loudspeaker, despite the fact that the input signal for this first loudspeaker is zero.

Further, said output impedance, which in practice is non-linear, causes a relatively large distortion component in the overall output signal.

It is a specific object of the present invention to improve the channel separation of a dual bridge amplifier stage.

According to an important aspect of the present invention, the channel separation of a dual bridge amplifier stage is improved by utilizing a feedback coupling over the loudspeaker.

Figure 2:
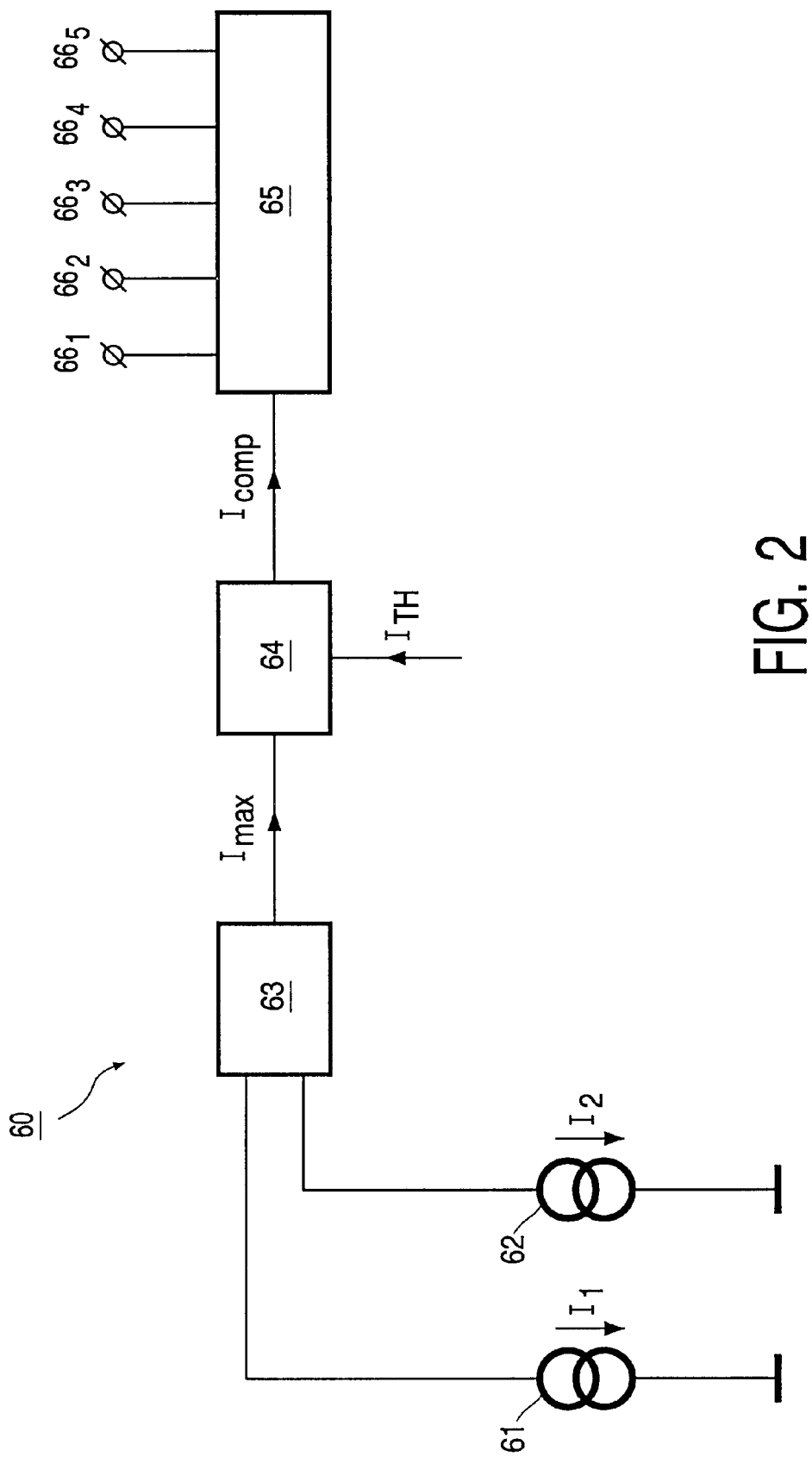

These and other aspects, characteristics and advantages of the present invention will be further clarified by the following description of a preferred embodiment of a dual bridge amplifier in accordance with the invention, with reference to the drawings, in which same reference numerals indicate equal or similar parts, and in which:

FIG. 1 shows schematically a block diagram of a dual bridge amplifier stage according to the present invention; and FIG. 2 shows schematically a block diagram of a bias current generating circuit.

FIG. 1 shows schematically a block diagram of a dual bridge amplifier stage 1 according to the present invention. The dual bridge amplifier 1 comprises a first input terminal 2 and a second input terminal 3, for receiving a first current input signal $I_{in1}$ and a second current input signal $I_{in2}$, respectively. The dual bridge amplifier 1 further comprises three output terminals 4, 5, 6. At the first output terminal 4, the dual bridge amplifier 1 generates a first output voltage signal $V_{OUT1}$, and at the second output terminal 5 a second voltage output signal $V_{OUT2}$ is generated. At the common output terminal 6, the dual bridge amplifier 1 generates a common output voltage signal $V_{OUTcommon}$. A first load such as a loudspeaker, shown in FIG. 1 as a resistor $R_{L1}$, is to be connected between the first output terminal 4 and the common output terminal 6. A second load such as a loudspeaker, shown in FIG. 1 as a resistor $R_{L2}$, is to be connected between the second output terminal 5 and the common output terminal 6.

It is to be noted that the input signals $I_{in1}$ and $I_{in2}$ may be output signals of any type of source, such as for instance a tuner, a CD player, etc.

The dual bridge amplifier 1 comprises a first amplifier 10 coupled between the first signal input 2 and the first signal output 4. The first amplifier 10 is a differential amplifier having an inverting input 11 connected to the first signal input 2 and an output 13 connected to the first output 4. The output voltage at the output 13 is fed back to the inverting input 11 through a first feedback resistor 14.

Similarly, the dual bridge amplifier 1 comprises a second amplifier 20 coupled between the second signal input 3 and the second signal output 5. The second amplifier 20 has an inverting input 21 connected to the second signal input 3 and an output 23 connected to the second signal output 5, a second feedback resistor 24 connecting the output 23 to the inverting input 21.

The dual bridge amplifier 1 comprises further a buffer amplifier 30 having an inverting input 31, a non-inverting input 32, and an output 33. The output 33 is connected to the common output terminal 6. A third feedback resistor 34 is connected between the output 33 and the inverting input 31. The non-inverting input 32 of the buffer amplifier 30 is connected to a reference voltage source 35, which provides a reference voltage $V_R$ which preferably is substantially equal to half the supply voltage $V_P$ of the dual bridge amplifier 1.

The dual bridge amplifier 1 comprises a first bias current source 41 generating a first bias current $I_{b1}$, connected to the inverting input 11 of the first amplifier 10. The dual bridge amplifier 1 comprises further a second current source 42 generating a second bias current $I_{b2}$, connected to a non-inverting input 12 of the first amplifier 10. The dual bridge amplifier 1 comprises further a third bias current source 43 generating a third bias current $I_{b3}$, connected to the inverting input 31 of the buffer amplifier 30. The dual bridge amplifier 1 comprises further a fourth bias current source 44 generating a fourth bias current $I_{b4}$, connected to a non-inverting input 22 of the second amplifier 20. The dual bridge amplifier 1 comprises further a fifth bias current source 45 generating a fifth bias current $I_{b5}$, connected to the inverting input 21 of the second amplifier 20.

FIG. 2 illustrates a bias current generating circuit 60 of the dual bridge amplifier 1. The bias current generating circuit 60 comprises a first current source 61 generating a first current 11 having a magnitude substantially equal to the first input current $I_{in1}$ received at the first signal input 2 of the dual bridge amplifier 1. The operation of the first current source 61 may be based on a current mirror, as will be clear to a person skilled in the art. Similarly, the bias current generating circuit 60 comprises a second current source 62 generating a second current $I_2$, the magnitude of which is equal to the second input current $I_{in2}$ received at the second signal input 3 of the dual bridge amplifier 1. The first current $I_1$ and the second current $I_2$ are fed to a maximum selector 63 that determines which of said two currents $I_1$ and $I_2$ is larger, and that provides an output current $I_{max}$ equal to the largest one of said two currents $I_1$ and $I_2$. A comparator 64 compares $I_{max}$ with a certain threshold level $I_{TH}$ equal to $V_P/R$. The comparator 64 outputs a current $I_{comp}$ which is equal to zero when $I_{max}$ is smaller than $I_{TH}$, and which is equal to $I_{max}$ if $I_{max}$ is larger than $I_{TH}$. A bias current generator 65 receives $I_{comp}$, and generates five bias currents $I_{b1}$, $I_{b2}$, $I_{b3}$, $I_{b4}$, $I_{b5}$ at respective current outputs $66_1$, $66_2$, $66_3$, $66_4$, $66_5$. The current generator 65 is dimensioned such that said five output currents $I_{b1}-I_{b5}$ are substantially equal to each other. The current generator 65 can be considered as being a combination of the five bias current sources 41–45 of FIG. 1.

In an alternative embodiment, the comparator 64 can be omitted, such that the bias current generator 65 receives an input current that is always equal to $I_{max}$. Then, the system is linear. Comparing $I_{max}$ with the threshold level $I_{TH}=V_P/R$, however, serves to minimize DC-errors. Herein, if the resistance values of the resistors 14, 24, 34, 51, 52 are equal to each other, the value R is slightly larger than said resistance value of the resistors 14, 24, 34, 51, 52, such that $I_b$ will only start to modulate when when one of the amplifiers 10, 20, 30 almost clips.

According to an important aspect of the present invention, the dual bridge amplifier 1 comprises a first common mode feedback resistor 51 which feeds the common output voltage $V_{OUTcommon}$ of the common output terminal 6 back to the non-inverting input 12 of the first amplifier 10, and a second common mode feedback resistor 52 which feeds said common mode output voltage $V_{OUTcommon}$ back to the non-inverting input 22 of the second amplifier 20. For optimum result, the first common mode feedback resistor 51 is connected as close as possible to the output 33 of the buffer amplifier 30, while similarly the second common mode feedback resistor 52 is preferably connected as close as possible to the output 33 of the buffer amplifier 30.

It can easily be shown that, with a suitable dimensioning of the components, the output voltage $V_{L1}=V_{OUT1}-V_{OUTcommon}$ over the first load $R_{L1}$ is only determined by the first input current $I_{in1}$ received at the first signal input 2 of the dual bridge amplifier 1, and that similarly the output voltage $V_{L2}$ over the second load $R_{L2}$ is only determined by the second input signal $I_{in2}$ received at the second signal input 3 of the dual bridge amplifier, with substantially no crosstalk, while the maximum output voltage is equal to the supply voltage $V_P$.

To this end, the five bias currents $I_{b1}-I_{b5}$ should all be substantially equal to each other, indicated as Ib, while also the five feedback resistors 14, 24, 34, 51, 52 should all have substantially the same resistance value R. This can be demonstrated as follows.

The current $I_{14}$ through the first feedback resistor 14 can be written as follows:

$$I_{14} = \frac{V_{13} - V_{11}}{R_{14}} = I_{in1} - I_{b1} \Rightarrow V_{OUT1} = V_{11} + (I_{in1} - I_{b1}) \cdot R_{14} \quad (1)$$

$$I_{51} = \frac{V_{OUTcommon} - V_{12}}{R_{51}} = -I_{b2} \Rightarrow V_{OUTcommon} = V_{12} - I_{b2} \cdot R_{51} \quad (2)$$

$$V_{L1} = \quad (3)$$
$$V_{OUT1} - V_{OUTcommon} = (V_{11} - V_{12}) - (I_{b1} \cdot R_{14} - I_{b2} \cdot R_{51}) + I_{in1} \cdot R_{14}$$

Similarly:

$$V_{L2}=V_{OUT2}-V_{OUTcommn}=(V_{21}-V_{22})-(I_{b5} \cdot R_{24}-I_{b4} \cdot R_{52})+I_{in2} \cdot R_{24} \quad (4)$$

Thus, if $I_{b1}*R_{14}$ equals $I_{b2}*R_{51}$, $V_{L1}$ will be equal to $I_{in1}R_{14}$, since the potentials $V_{11}$ and $V_{12}$ at the inputs 11 and 12 of the first amplifier 10 will be equal to each other. Similarly, if $I_{b5}*R_{24}$ equals $I_{b4}*R_{52}$, $V_{L2}$ will be equal to $I_{in2}R_{24}$. The easiest practical realisation of these conditions is implemented if the resistance values $R_{51\ and\ R14}$ of the first common mode feedback resistor 51 and the first feedback resistor 14, respectively, are equal to each other while also the first and second bias currents $I_{b1}$ and $I_{b2}$, respectively, are equal to each other, and if the resistance values $R_{52}$ and $R_{24}$ of the second common mode feedback resistor 52 and the second feedback resistor 24, respectively, are equal to each other while also the fourth and fifth bias currents $I_{b4}$ and $I_{b5}$, respectively, are equal to each other.

If the resistance values $R_{51}$, $R_{14}$, $R_{52}$, $R_{24}$, and $R_{34}$ of the first common mode feedback resistor 51, the first feedback resistor 14, the second common mode feedback resistor 52, the second feedback resistor 24, and the third feedback resistor 34, respectively, are all equal to each other while also the first, second, fourth, fifth and third bias currents $I_{b1}$, $I_{b2}$, $I_{b4}$, $I_{b5}$, and $I_{b3}$, respectively, are all equal to each other, the voltage levels at the inverting inputs 11, 21, 31 and non-inverting inputs 12, 22, 32 of the anplifiers 10, 20, 30, respectively, are all equal to $V_p/2$. This is advantageous for a number of reasons. For instance, the input stages of the amplifiers can be of simple design, since they do not need to handle a rail-to-rail voltage. Further, the current generators generating the currents $I_b$ and $I_{in}$ can be of simple design, since all current sources experience a voltage drop of $V_p/2$ and any possible output impedance of a current source will not result in generating a distortion component of the output signal.

Thus, the present invention succeeds in improving the channel separation in a dual bridge amplifier by utilizing a feedback coupling over the load.

It should be clear to a person skilled in the art that the scope of the present invention is not limited to the examples discussed in the above, but that several amendments and modifications are possible without departing from the scope of the invention as defined in the appending claims.

For instance, the maximum selector 63 and/or the comparator 64 and/or the current generator 65 may be implemented as one single device.

Further, although the present invention is not limited to application in a car audio system for handling the front/rear signals, the present invention is particularly useful in such system in view of the fact that the front sound signals and the rear sound signals only have a difference in volume, i.e. $I_{in1}/I_{in2}$ is constant.

What is claimed is:

1. Dual bridge amplifier (1) for processing two input signals ($I_{in1}$; $I_{in2}$) and providing two amplified output signals ($V_{L1}$; $V_{L2}$) into two separate loads, comprising two signal amplifiers (10; 20) and one common buffer amplifier (30), wherein the output signals ($V_{L1}$; $V_{L2}$) are fed back into the respective signal amplifier (10; 20), the dual bridge amplifier further including a first common mode feedback resistor having a first end connected to the output of the common buffer amplifier and having its opposite end connected to a non-inverting input of the first signal amplifier, and a second common mode feedback resistor having a first end connected to the output of the common buffer amplifier and having its opposite end connected to a non-inverting input of the second signal amplifier.

2. Dual bridge amplifier according to claim 1, wherein the output signal ($V_{OUTcommon}$) of the common buffer amplifier (30) is fed back to inputs (12; 22) of the signal amplifiers (10; 20).

3. Dual bridge amplifier (1), comprising:
   a first input terminal (2) and a second input terminal (3);
   a first output terminal (4) and a second output terminal(5);
   a first amplifier (10) having an inverting input (11) coupled to the first signal input (2) and having an output (13) coupled to the first signal output (4), wherein a first feedback resistor (14) is connected to the inverting input (11) and to the output (13) of the first amplifier (10);
   a second amplifier (20) having an inverting input (21) coupled to the second signal input (3) and having an output (23) coupled to the second signal output (5), wherein a second feedback resistor (24) is connected to the inverting input (21) and to the output (23) of the second amplifier (20);
   a buffer amplifier (30) having a non-inverting input (32) coupled to a voltage reference source (35) and having an output (33) coupled to a common output terminal (6), wherein a third feedback resistor (34) is connected to the output (33) and to an inverting input (31) of the buffer amplifier (30);
   wherein a first common mode feedback resistor (51) is connected to the output (33) of the buffer amplifier (30) and to a non-inverting input (12) of the first amplifier (10), and wherein a second common mode feedback resistor (52) is connected to the output (33) of the buffer amplifier (30) and to a non-inverting input (22) of the second amplifier (20);
   and wherein the inverting input (11) of the first amplifier (10) is coupled to receive a first bias current ($I_{b1}$) from a first bias current source (41),
   wherein the non-inverting input (12) of the first amplifier (10) is coupled to receive a second bias current ($I_{b2}$) from a second bias current source (42),
   wherein the inverting input (31) of the buffer amplifier (30) is coupled to receive a third bias current ($I_{b3}$) from a third bias current source (43),
   wherein the non-inverting input (22) of the second amplifier (20) is coupled to receive a fourth bias current ($I_{b4}$) from a fourth bias current source (44), and
   wherein the inverting input (21) of the second amplifier (20) is coupled to receive a fifth bias current ($I_{b5}$) from a fifth bias current source (45).

4. Amplifier according to claim 3, wherein the product ($I_{b1}*R_{14}$) of the first bias current ($I_{b1}$) and the resistance value ($R_{14}$) of the first feedback resistor (14) is substantially equal to the product ($I_{b2}*R_{51}$) of the second bias current ($I_{b2}$) and the resistance value ($R_{51}$) of the first common mode feedback resistor (51), and wherein the product ($I_{b5}*R_{24}$) of the fifth bias current ($I_{b5}$) and the resistance value ($R_{24}$) of the second feedback resistor (24) is substantially equal to the product ($I_{b4}*R_{52}$) of the fourth bias current ($I_{b4}$) and the resistance value ($R_{52}$) of the second common mode feedback resistor (52).

5. Amplifier according to claim 4, wherein
   the resistance value ($R_{14}$) of the first feedback resistor (14) is substantially equal to the resistance value ($R_{51}$) of the first common mode feedback resistor (51);
   wherein the resistance value ($R_{24}$) of the second feedback resistor (24) is substantially equal to the resistance value ($R_{52}$) of the second common mode feedback resistor (52);
   wherein the first bias current ($I_{b1}$) is substantially equal to the second bias current ($I_{b2}$); and
   wherein the fourth bias current ($I_{b4}$) is substantially equal to the fifth bias current ($I_{b5}$).

6. Amplifier according to claim 5, wherein the resistance value ($R_{34}$) of the third feedback resistor (34), the resistance value ($R_{51}$) of the first common mode feedback resistor (51), and the resistance value ($R_{52}$) of the second common mode feedback resistor (52) are substantially equal to each other, and wherein the third bias current ($I_{b3}$), the second bias current ($I_{b2}$), and the fourth bias current ($I_{b4}$) are substantially equal to each other.

7. Amplifier according to any of the previous claims, wherein said five bias currents ($I_{b1}$–$I_{b5}$) have substantially the same magnitude, this magnitude being substantially equal to the largest one of the magnitudes of the two input signal ($I_{in1}$; $I_{in2}$).

8. Amplifier according to claim 7, wherein the magnitude of said bias currents is substantially zero if the largest magnitude of said input signals is less than a predetermined threshold value ($I_{TH}$).

9. Amplifier according to claim 8, as far as depending on claim 6 wherein said threshold value ($I_{TH}$) is equal to $V_P/R$, wherein $V_P$ is the supply voltage, and wherein R is slightly larger than said resistance values ($R_{14}$, $R_{24}$, $R_{34}$, $R_{51}$, $R_{52}$).

* * * * *

UNITED STATES PATENT AND TRADEMARK OFFICE
CERTIFICATE OF CORRECTION

PATENT NO. : 6,563,380 B2
DATED : May 13, 2003
INVENTOR(S) : Jan Paulus Freek Huijser It is certified that error appears in the above-identified patent and that said Letters Patent is hereby corrected as shown below:

<u>Title page,</u>
Insert item [73]:
-- [73] Assignee: Koninklijke Philips Electronics N.V., Eindhoven (NL) --.

Signed and Sealed this

Twenty-sixth Day of August, 2003

JAMES E. ROGAN
*Director of the United States Patent and Trademark Office*